United States Patent [19]

Sano et al.

[11] Patent Number: 5,693,957
[45] Date of Patent: Dec. 2, 1997

[54] PHOTOVOLTAIC ELEMENT AND METHOD OF MANUFACTURING THE SAME

[75] Inventors: Keiichi Sano, Moriguchi; Yoichiro Aya, Hirakata, both of Japan

[73] Assignee: Sanyo Electric Co., Ltd., Moriguchi, Japan

[21] Appl. No.: 451,575

[22] Filed: May 26, 1995

[30] Foreign Application Priority Data

Jun. 14, 1994 [JP] Japan ................................. 6-132115
Feb. 22, 1995 [JP] Japan ................................. 7-034057

[51] Int. Cl.⁶ ................................................ H01L 31/0376
[52] U.S. Cl. ......................... 257/51; 257/53; 257/75; 136/258
[58] Field of Search ........................... 257/51, 52, 53, 257/56, 65, 75; 136/258

[56] References Cited

U.S. PATENT DOCUMENTS

| | | | |
|---|---|---|---|
| 4,528,082 | 7/1985 | Moustakas et al. | 257/53 |
| 4,529,679 | 7/1985 | Ogawa et al. | 257/56 |
| 4,536,607 | 8/1985 | Wiesmann | 257/53 |
| 4,923,524 | 5/1990 | Kiss | 257/51 |

FOREIGN PATENT DOCUMENTS

| | | | |
|---|---|---|---|
| 61-244073 | 10/1986 | Japan | 257/56 |
| 63-280453 | 11/1988 | Japan | 257/51 |
| 1-194370 | 8/1989 | Japan | 257/53 |
| 2-246171 | 10/1990 | Japan | 257/53 |
| 3-30478 | 2/1991 | Japan | 257/52 |
| 3-112175 | 5/1991 | Japan | 257/53 |

OTHER PUBLICATIONS

Preparation of High-Quality n-Type Poly-Si Films by the Solid Phase Crystallization (SPC) Method by T. Matsuyama et al. Japanese Journal of Applied Physics, vol. 29, No. 11 Nov. 1990, pp. 2327–2331.

Improvement of n-Type Poly-Si Film Properties by Solid Phase Crystallization Method by T. Matsuyama et al, Jpn. J. Appl. Phys. vol. 32(1993) pp. 3720–3728 Sep. 1993.

Development of New a-Si/c-Si Heterojunction Solar Cells: ACJ-HIT (Artificially Constructed Junction-Heterojunction with Intrinsic Thin-Layer) by Makoto Tanaka et al, Jpn. J. Appl. Phys. vol. 31 (1992) pp. 3518–3522 Nov. 1992.

Primary Examiner—Mahshid D. Saadat
Assistant Examiner—John Guay
Attorney, Agent, or Firm—W. G. Fasse; W. F. Fasse

[57] ABSTRACT

A photovoltaic element is produced by forming a plurality of layers of amorphous semiconductor thin films on a substrate, whereby at least one of the plurality of layers contains an impurity that hinders crystallization resulting from thermal annealing, and then thermally annealing the amorphous semiconductor thin films thereby crystallizing the film except for the layer containing the impurity. In the finished photovoltaic element, the resulting crystalline semiconductor film and the non-crystallized, amorphous semiconductor film can form a heterojunction. The amorphous film can be arranged closer to the substrate, i.e. between the crystalline film and the substrate.

11 Claims, 3 Drawing Sheets

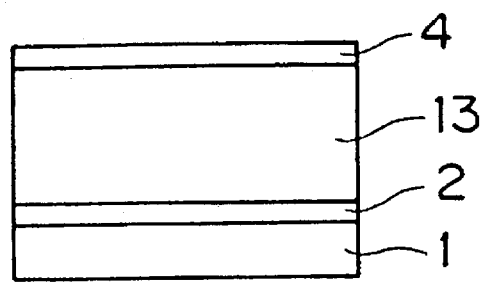
FIG. 3(a)
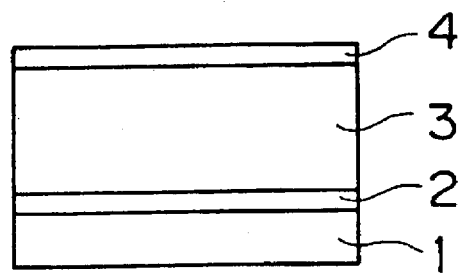
FIG. 3(b)
FIG. 4
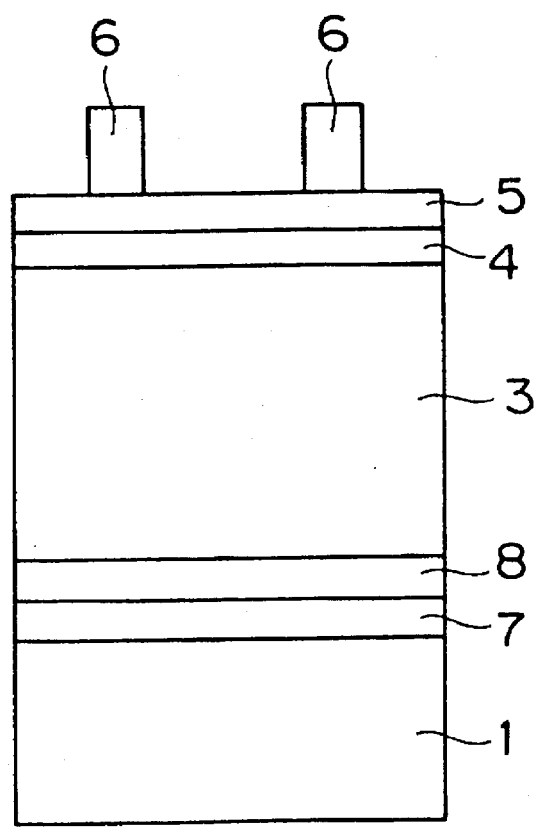

PHOTOVOLTAIC ELEMENT AND METHOD OF MANUFACTURING THE SAME

BACKGROUND OF THE INVENTION

1. Field of the Invention

The present invention relates to a photovoltaic element for directly converting light energy such as solar energy to electric energy, and a method of manufacturing the same.

2. Description of the Background Art

In general, a thin-film polycrystalline silicon solar battery comprising a polycrystalline silicon semiconductor thin film which is formed on a substrate for serving as a photoactive layer is known in the art. Various methods of forming polycrystalline silicon thin films on substrates are known, such as a method of melting an amorphous silicon thin film, which has been formed on a substrate, with an electron beam or light at a high temperature of at least 1400° C. thereby recrystallizing the same, and a method of annealing an amorphous silicon thin film, which has been formed on a substrate, at a temperature of about 600° C. for crystallizing the same.

In such a thin-film polycrystalline silicon solar battery having a polycrystalline silicon thin film which is formed by the melting method or the annealing method, however, an amorphous silicon thin film cannot be formed on the substrate side adjacent to the polycrystalline silicon thin film. When an amorphous silicon thin film is crystallized by the melting method or the annealing method, an underlayer which is formed by another amorphous silicon thin film is also crystallized. Therefore, it has been impossible to manufacture a thin-film polycrystalline silicon solar battery having a polycrystalline silicon thin film which is placed on an amorphous silicon thin film.

SUMMARY OF THE INVENTION

An object of the present invention is to provide a method which can manufacture a photovoltaic element having an amorphous semiconductor thin film and a crystalline semiconductor thin film which are provided on a substrate so that the amorphous semiconductor thin film is formed on the substrate side, i.e. closer to the substrate.

A method of manufacturing a photovoltaic element according to the present invention comprises a step of forming a plurality of layers of amorphous semiconductor thin films on a substrate so that at least one of the plurality of layers contains an impurity that hinders crystallization resulting from thermal annealing, and a step of thermally annealing the amorphous semiconductor thin films thereby crystallizing the same except the layer containing the impurity that hinders crystallization.

According to an aspect of the inventive method, the layer containing the impurity hindering crystallization resulting from thermal annealing is at least one of uppermost and lowermost layers of the amorphous semiconductor thin films.

The impurity hindering crystallization can be prepared from carbon, oxygen, nitrogen, fluorine or the like. A gas containing such an impurity can be introduced into a raw material gas during formation of the amorphous semiconductor thin film, so that this film contains the impurity.

According to the inventive method, it is possible to manufacture a photovoltaic element having an amorphous semiconductor thin film on a substrate side by providing the amorphous semiconductor thin film containing an impurity hindering crystallization by solid phase epitaxy on the substrate side.

Further, it is possible to manufacture a photovoltaic element having a heterojunction by forming adjacent to each other a crystalline semiconductor thin film which is crystallized to serve as a photoactive layer, and an amorphous semiconductor thin film which contains an impurity hindering crystallization resulting from thermal annealing. In addition, it is possible to form a BSF (back surface field) structure of a heterojunction by preparing the amorphous semiconductor thin film containing the impurity hindering crystallization to be identical in conductivity type to, and higher in impurity concentration than, the crystalline semiconductor thin film. Due to formation of such a BSF structure, the crystalline semiconductor thin film of the inventive photovoltaic element can be further improved in photoelectric conversion efficiency.

A photovoltaic element according to the present invention can be manufactured by the aforementioned method of the present invention, and comprises a substrate, a crystalline semiconductor thin film, which is formed by thermally annealing an amorphous semiconductor thin film, and which is provided on the substrate, and an amorphous semiconductor thin film, which contains an impurity that hinders crystallization resulting from thermal annealing, and which forms a heterojunction with the crystalline semiconductor thin film.

As hereinabove described, it is possible to form a BSF structure of a heterojunction by preparing the amorphous semiconductor thin film containing the impurity hindering crystallization to be identical in conductivity type to the crystalline semiconductor thin film and higher in impurity concentration than the crystalline semiconductor thin film.

Alternatively, it is possible to form a p-n or n-p heterojunction by preparing the amorphous semiconductor thin film containing the impurity hindering crystallization in a conductivity type which is different from that of the crystalline semiconductor thin film.

The amorphous semiconductor thin film containing the impurity hindering crystallization can be in a multilayer structure of at least two layers. For example, the amorphous semiconductor thin film can be in a two-layer structure of an intrinsic amorphous semiconductor layer which is joined with the crystalline semiconductor thin film, and an amorphous semiconductor layer which is in contact with the intrinsic amorphous semiconductor layer. In this case, it is possible to form a photovoltaic element comprising the intrinsic amorphous semiconductor layer on a p-n junction interface by bringing the amorphous semiconductor layer into a conductivity type which is different from that of the crystalline semiconductor thin film. When the amorphous semiconductor layer is prepared in the same conductivity type as the crystalline semiconductor thin film, on the other hand, it is possible to form a BSF structure of a heterojunction which is further improved in interface characteristics by interposition of the intrinsic amorphous semiconductor layer.

According to the present invention, it is possible to form an amorphous semiconductor thin film on a substrate side of a photoactive layer in a photovoltaic element in which the photoactive layer is crystallized by thermal annealing. It is possible to form a BSF structure of a heterojunction or a p-n junction by providing such an amorphous semiconductor thin film adjacently to the crystalline semiconductor thin film, thereby obtaining a photovoltaic element having higher conversion efficiency as compared with the prior art. Further, a solar battery having such high conversion efficiency can be manufactured through simple steps.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a) and 3(b) are sectional views showing other steps of manufacturing the photovoltaic element shown in FIG. 1; and FIG. 4 is a sectional view showing a photovoltaic element according to another embodiment of the present invention.

DETAILED DESCRIPTION OF THE PREFERRED EXAMPLE EMBODIMENTS AND OF THE BEST MODE OF THE INVENTION

Figure 1:
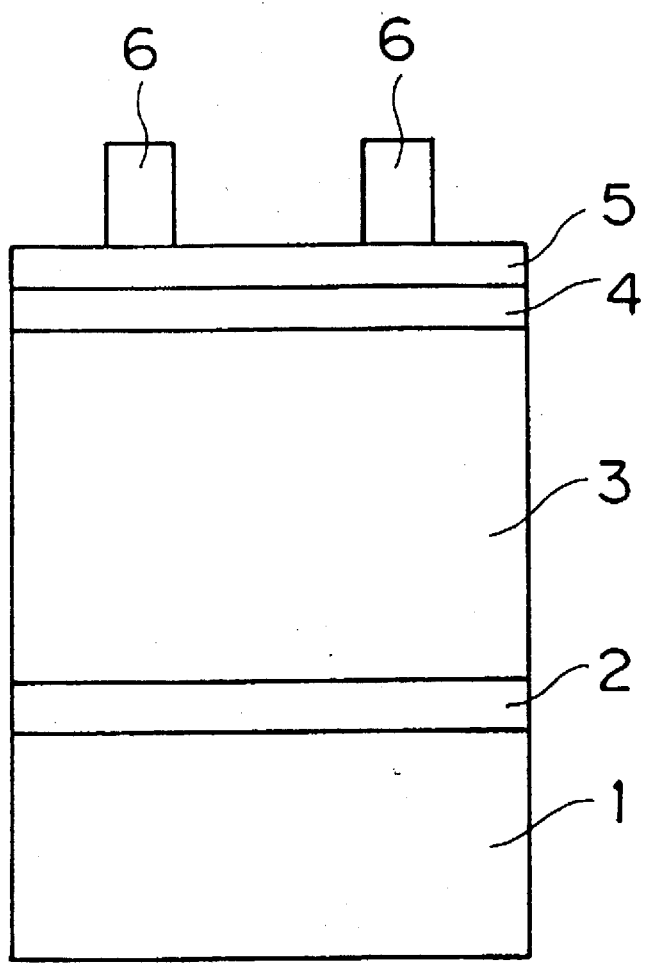
FIG. 1 is a sectional view showing a photovoltaic element according to an embodiment of the present invention.

FIG. 1 is a sectional view showing the structure of a photovoltaic element according to an embodiment of the present invention. Referring to FIG. 1, an n-type amorphous silicon thin film 2 is formed on a metal substrate 1 of tungsten, in a thickness of about 500 Å. While the metal substrate 1 is made of tungsten in this embodiment, another metal substrate of stainless or aluminum, or a ceramic substrate which is coated with a metal is also employable. An n-type polycrystalline silicon thin film 3 is formed on the n-type amorphous silicon thin film 2, in a thickness of about 10 μm. This n-type polycrystalline silicon thin film 3 is so formed that it has a specific resistance of about 1 Ω·cm. A p-type amorphous silicon thin film 4 is formed on the n-type polycrystalline silicon thin film 3, in a thickness of about 50 to 200 Å. A transparent electrode layer 5 of ITO or the like is formed on the p-type amorphous silicon thin film 4, in a thickness of about 700 Å. Further, collector electrodes 6 of silver or the like are formed on the transparent electrode layer 5 in thicknesses of about 2 μm. According to this embodiment, the n-type amorphous silicon thin film 2 is formed as an underlayer for the n-type polycrystalline silicon thin film 3 which is a photoactive layer, thereby forming a BSF structure of a heterojunction.

Figure 2A:
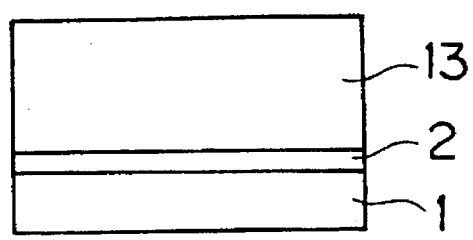
FIGS. 2(a) to 2(e) are sectional views showing steps of manufacturing the photovoltaic element shown in FIG. 1.

FIGS. 2(a) to 2(e) are sectional views showing steps of manufacturing the photovoltaic element shown in FIG. 1. Referring to FIG. 2(a), the n-type amorphous silicon thin film 2 is first formed on the metal substrate 1 which is heated to 500° C. The n-type amorphous silicon thin film 2 can be formed by plasma CVD, for example. In this film formation, an impurity that hinders crystallization resulting from thermal annealing is introduced into the n-type amorphous silicon thin film 2. According to this embodiment, methane ($CH_4$) is employed as a gas which is introduced into a raw material gas, so that the n-type amorphous silicon thin film 2 contains carbon as the impurity. Conditions for forming the n-type amorphous silicon thin film 2 are shown in Table 1. Alternatively, oxygen, fluorine or nitrogen can be introduced into the n-type amorphous silicon thin film 2 as the impurity hindering crystallization, through the introduction of carbon dioxide ($CO_2$), silane fluoride ($SiF_{4-x}H_x$, X=0 to 3) or ammonia ($NH_3$) during film formation.

Figure 2B:
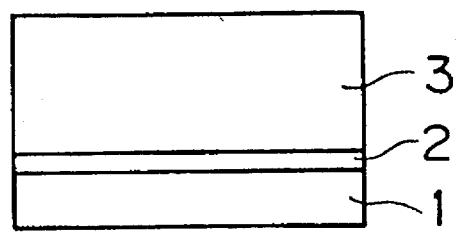

Another amorphous silicon thin film 13, which is doped with phosphorus (P), is formed on the n-type amorphous silicon thin film 2 by plasma CVD, for example. Conditions for forming the amorphous silicon thin film 13 doped with phosphorus are shown in Table 1. Thereafter the amorphous silicon thin film 13 is thermally annealed under a nitrogen atmosphere at about 600° C. to be crystallized, thereby forming the n-type polycrystalline silicon thin film 3, as shown in FIG. 2(b). In this thermal annealing step, the n-type amorphous silicon thin film 2 containing the impurity that hinders crystallization is not crystallized.

Figure 2C:
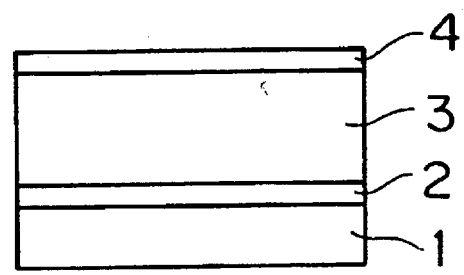
Figure 2D:
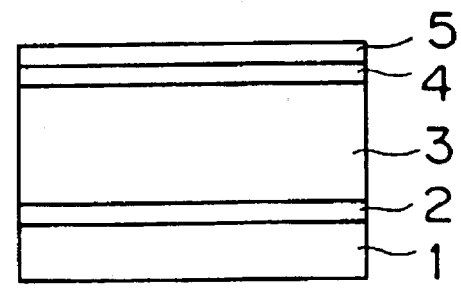

Referring to FIG. 2(c), a surface of the n-type polycrystalline silicon thin film 3 is washed and thereafter the p-type amorphous silicon thin film 4, which is doped with boron (B), is formed at 120° C. by plasma CVD. Conditions for forming the p-type amorphous silicon thin film 4 are shown in Table 1. Referring to FIG. 2(d), the transparent electrode layer 5 of ITO or the like is formed on the p-type amorphous silicon thin film 4 by sputtering, CVD or vapor deposition.

Figure 2E:
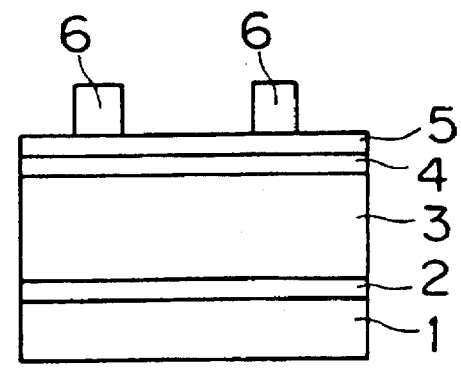

Referring to FIG. 2(e), the collector electrodes 6 of silver are formed on the transparent electrode layer 5 by vapor deposition or screen printing.

TABLE 1

| | Substrate Temperature (°C.) | Gase Flow Rate (SCCM) | Pressure (Torr) | RF Power (mW/cm$^2$) |
|---|---|---|---|---|
| Amorphous Silicon Thin Film 2 | 500 | $SiH_4$:4, $CH_4$:10 $PH_3$:0.02, $H_2$:100 | 0.15 | 30 |
| Amorphous Silicon Thin Film 13 | 500 | $SiH_4$:40, $PH_3$:1 × 10$^{-5}$ | 0.5 | 300 |
| Amorphous Silicon Thin Film 4 | 120 | $SiH_4$:5, $B_2H_6$:0.1 $H_2$:100 | 0.2 | 30 |

A sample of a thin-film polycrystalline silicon solar battery obtained in the aforementioned manner was subjected to evaluation of its characteristics. For the purpose of comparison, another sample of a thin-film polycrystalline solar battery was prepared by directly forming the amorphous silicon thin film 13 on the metal substrate 1 without forming of the n-type amorphous silicon thin film 2, and crystallizing the same by solid phase crystallization for forming the polycrystalline silicon thin film 3, and was then similarly subjected to evaluation of characteristics.

As a result, open circuit voltage, short-circuit current, fill factor and conversion efficiency were improved in the inventive sample from 0.4 V to 0.45 V, from 25 mA/cm$^2$ to 26 mA/cm$^2$, from 0.5 to 0.6 and from 5% to 7% respectively, as compared with the comparative sample.

While the p-type amorphous silicon thin film 4 is formed on the n-type polycrystalline thin film 3 in the aforementioned embodiment, an i-type amorphous silicon thin film may be interposed between the n-type polycrystalline silicon thin film 3 and the p-type amorphous silicon thin film 4.

While the heterojunction is formed by the films of the same conductivity type in the aforementioned embodiment, the heterojunction may alternatively be formed by films of different conductivity types. For example, the n-type and p-type amorphous silicon thin films 2 and 4 may be replaced by p-type and n-type amorphous silicon thin films respectively, for forming a p-n-n junction structure.

After the amorphous silicon thin film 13 is formed as shown in FIG. 2(a), a p-type amorphous silicon thin film 4 containing an impurity that hinders crystallization may alternatively be formed thereon as shown in FIG. 3(a), so that only the amorphous silicon thin film 13 is thereafter crystallized by thermal annealing for forming an n-type polycrystalline silicon thin film 3, as shown in FIG. 3(b).

FIG. 4 is a sectional view showing the structure of a photovoltaic element according to another embodiment of the present invention. Referring to FIG. 4, the photovoltaic element according to this embodiment has a multilayer film structure consisting of an intrinsic amorphous silicon thin film 8 and an n-type amorphous silicon thin film 7, in place of the n-type amorphous silicon thin film 2 of the photovoltaic element shown in FIG. 1. According to this embodiment, an n-type polycrystalline silicon thin film 3 and the n-type amorphous silicon thin film 7 form a heterojunction through the intrinsic amorphous silicon thin film 8. Therefore, the photovoltaic element according to this embodiment is formed in order of n-i-n-p from a substrate 1 side.

The photovoltaic element according to this embodiment can be manufactured through steps similar to those for the photovoltaic element shown in FIG. 1, except conditions for forming the intrinsic amorphous silicon thin film 8 and the n-type amorphous silicon thin film 7.

As to formation of the intrinsic amorphous silicon thin film 8, the following conditions can be employed, for example:

Substrate Temperature: 500° C.
Gas Flow Rate: $SiH_4$ 4 sccm, $CH_4$ 10 sccm, $H_2$ 100 sccm
Pressure: 0.15 Torr
RF Power: 30 mW/cm$^2$ As to formation of the n-type amorphous silicon thin film 7, the following conditions can be employed, for example:

Substrate Temperature: 500° C.
Gas Flow Rate: $SiH_4$ 4 sccm, $CH_4$ 10 sccm, $PH_3$ 0.2 sccm, $H_2$ 100 sccm
Pressure: 0.15 Torr
RF Power: 30 mW/cm$^2$ According to the present invention, it is possible to form a BSF structure of a heterojunction on the substrate side by providing the amorphous semiconductor thin film containing the impurity hindering crystallization on the substrate side while preparing this amorphous semiconductor thin film in the same conductivity type as the crystalline semiconductor thin film which is formed thereon, as in the embodiment shown in FIG. 4. In such a BSF structure, further, it is possible to improve interface characteristics by providing the intrinsic amorphous semiconductor layer between the n-type crystalline semiconductor thin film and the n-type amorphous semiconductor layer.

While the amorphous semiconductor thin film containing the impurity hindering crystallization and the crystalline semiconductor thin film which is crystallized by solid phase epitaxy are provided adjacently to each other in each of the aforementioned embodiments, the present invention is not restricted to this but is also applicable to a photovoltaic element comprising an amorphous semiconductor thin film containing an impurity hindering crystallization and a crystalline semiconductor thin film crystallized by thermal annealing, which are separated from each other.

Further, the effect of the present invention can be attained also when the p and n types are reversed in each of the aforementioned embodiments, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic element comprising:
   a substrate;
   a transparent electrode layer;
   a crystalline semiconductor thin film, that has been formed by thermally annealing a first amorphous semiconductor thin film, and that is interposed between said substrate and said transparent electrode layer; and
   a second amorphous semiconductor thin film, that contains an impurity that hinders crystallization resulting from thermal annealing, that forms a heterojunction with said crystalline semiconductor thin film, and that is interposed between said substrate and said transparent electrode layer on a substrate side with respect to said crystalline semiconductor thin film;
   wherein said second amorphous semiconductor thin film has a same conductivity type as, and a higher impurity concentration than, said crystalline semiconductor thin film.

2. The photovoltaic element in accordance with claim 1, wherein said substrate is a metal substrate.

3. The photovoltaic element in accordance with claim 1, wherein said substrate comprises a ceramic coated with a metal.

4. The photovoltaic element in accordance with claim 1, wherein said impurity that hinders crystallization comprises carbon.

5. The photovoltaic element in accordance with claim 1, wherein said impurity that hinders crystallization comprises oxygen.

6. The photovoltaic element in accordance with claim 1, wherein said impurity that hinders crystallization comprises at least one of nitrogen and fluorine.

7. A photovoltaic element comprising:
   a substrate;
   a crystalline semiconductor thin film that has a first conductivity type, that is arranged directly or indirectly on said substrate, and that has been formed by thermally annealing a first amorphous semiconductor thin film; and
   a second amorphous semiconductor thin film that contains an impurity that hinders crystallization resulting from thermal annealing, and that forms a heterojunction with said crystalline semiconductor thin film;
   wherein said second amorphous semiconductor thin film has a multilayer structure comprising an intrinsic amorphous semiconductor layer joined with said crystalline semiconductor thin film, and an amorphous semiconductor layer that also has said first conductivity type, and that is arranged in contact with said intrinsic amorphous semiconductor layer.

8. The photovoltaic element in accordance with claim 7, wherein said second amorphous semiconductor thin film has said first conductivity type and has a higher impurity concentration than does said crystalline semiconductor thin film.

9. The photovoltaic element in accordance with claim 7, wherein said second amorphous semiconductor thin film is arranged between said crystalline semiconductor thin film and said substrate.

10. The photovoltaic element in accordance with claim 7, wherein said substrate is a metal substrate.

11. The photovoltaic element in accordance with claim 7, wherein said substrate comprises a ceramic coated with a metal.

* * * * *

UNITED STATES PATENT AND TRADEMARK OFFICE
CERTIFICATE OF CORRECTION

PATENT NO. : 5,693,957

DATED : Dec. 2, 1997

INVENTOR(S) : Sano et al.

It is certified that error appears in the above-identified patent and that said Letters Patent is hereby corrected as shown below:

Col. 4, Table 1, Third column, in the heading, replace "Gase" by --Gas--.

Signed and Sealed this

Twenty-fourth Day of February, 1998

Attest:

BRUCE LEHMAN

*Attesting Officer*     *Commissioner of Patents and Trademarks*